United States Patent [19]

Kurihara

[11] 4,107,649
[45] Aug. 15, 1978

[54] CHECK SYSTEM FOR DETECTING MALFUNCTION OF AN ERROR DETECTION CIRCUIT

[75] Inventor: Yasuo Kurihara, Kawasaki, Japan

[73] Assignee: Fujitsu Limited, Kawasaki, Japan

[21] Appl. No.: 750,649

[22] Filed: Dec. 15, 1976

[30] Foreign Application Priority Data

Dec. 30, 1975 [JP] Japan .................................. 50-158119

[51] Int. Cl.² .............................................. G06F 11/10
[52] U.S. Cl. ........................................... 340/146.1 AG
[58] Field of Search ............................ 340/146.1 AG, ; 235/153 AP, 153 BB

[56] References Cited

U.S. PATENT DOCUMENTS

| | | | |
|---|---|---|---|
| 3,119,098 | 1/1964 | Meade | 340/146.1 AG X |
| 3,342,983 | 9/1967 | Pitkowsky et al. | 235/153 BB |
| 3,562,711 | 2/1971 | Davis et al. | 340/146.1 AG |
| 3,911,261 | 10/1975 | Taylor | 235/153 AP |

*Primary Examiner*—Jerry Smith
*Attorney, Agent, or Firm*—Staas & Halsey

[57] ABSTRACT

In an error detection circuit of a data processing circuit having a parity generator, a parity signal is predicted from an initial value determined by the data storing state of the data processing circuit in its initial state and a count value of the number of logic "1" or "0" in input data of the data processing circuit and/or the number of logic "1" "0" of output data, obtained by counters or the like. A parity signal derived from the parity generator is compared with the predicted parity signal to detect malfunction of the error detection circuit.

14 Claims, 5 Drawing Figures

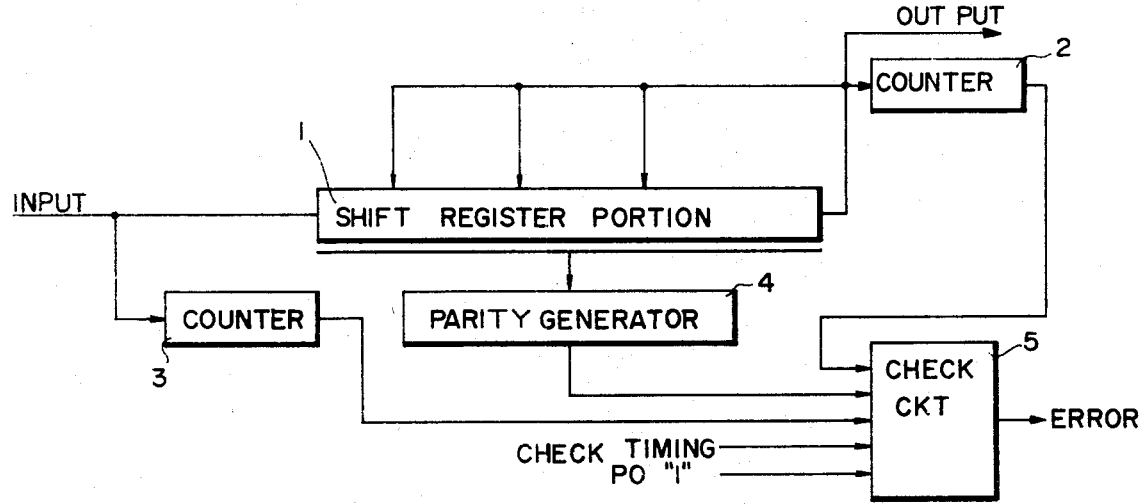

CHECK SYSTEM FOR DETECTING MALFUNCTION OF AN ERROR DETECTION CIRCUIT

BACKGROUND OF THE INVENTION

1. Field of the Invention

This invention relates to a check system for detecting malfunction of an error detection circuit.

2. Description of the Prior Art

In data transfer inside a computer, or a data transmission between input/output units, there are some occasions when an unnecessary bit is picked or a necessary bit is omitted on account of external noise, a decrease in the output from an amplifier used, or the like.

To avoid this, there has been provided an error detection circuit in a data processing circuit at a place where an error is likely to occur, for example, in a buffer register which achieves data transfer between it and a memory, or in a buffer register which performs data transfer between it and a logical operation circuit or an input-/output unit. With speeding up or complication of equipment, however, it is considered quite possible that the error detection circuit itself may make an error in some cases.

In some of the counters, registers or the like which operate in synchronism with clock pulses, a change in the number of 1, that is, a parity change, can be predicted from the state before one cycle period ($1t$) has passed. In such a case, it is possible to check malfunction of the error detection circuit itself by using the predicted value, but in the case where the $1\,t$ period is short, a logic circuit for checking the operation of the error detection circuit must be formed with high-speed elements. Further, it may also be necessary to employ clock pulses for the timing of the check in some cases.

SUMMARY OF THE INVENTION

Accordingly, this invention is directed to providing a system wherein it is possible to construct, with low-speed elements, a circuit for checking an error detection circuit for use in a data processing circuit of short cycle period.

Briefly stated, according to this invention, in an error detection circuit which comprises a shift register having a plurality of storing stages which sequentially shifts input data and feeds back output data from an output stage to desired ones of the stages, and a parity generator, and in which a parity signal is generated from the parity generator in accordance with the data storing state of the shift register, the parity signal is predicted from an initial value determined by the data storing state of the shift register in its initial state, the number of input data of logic "1" provided as an input to the shift register and/or the number of output data of logic "1" provided as an output from the shift register, and wherein the parity signal derived from the parity generator is compared with the predicted parity signal in order to detect malfunction of the error detection circuit based on the result of the comparison.

DESCRIPTION OF THE PREFERRED EMBODIMENTS

The logic which generates a predictive parity predictable from the state before one cycle period ($1t$) in a register or the like, is expressed by a kind of recurrence formula. The present invention expands the recurrence formula to obtain the value of its nth term, compares the value with a parity signal obtained actually from an error detection circuit, and checks malfunction of the error detection circuit based on the result of the comparison.

The invention will hereinafter be described as being applied to an error correcting circuit.

For checking whether or not a shift register is in its normal operation following read or write of data, the following formulae may be considered.

In the case where the shift register has an odd number of feedback loops, the parity (a predictive parity) $(PA)_n$ of the shift register when an nth data $(ID)_n$ has entered therein is expressed as follows:

$$(PA)_n = (PA)_{n-1} \oplus (ID)_n \tag{1}$$

where $(PA)_{n-1}$ is an $(n-1)$th parity. In the case where the shift register has an even number of feedback loops, the parity (a predictive parity) $(PA)_n$ of the shift register when the nth data $(ID)_n$ has entered therein is given by the following formula:

$$(PA)_n = (PA)_{n-1} \oplus (ID)_n \oplus (OD)_n \tag{2}$$

where $(OD)_n$ is output data, which is the data fed back to the shift register, i.e., the data delivered out from the last bit of the shift register. $\oplus$ indicates the addition of a modulo-two.

In other words, the formula (1) implies that when input data is "1", the parity of the shift register reverses, and the formula (2) implies that when the input data and the output data differ from each other, the parity of the shift register reverses. Further, the formula (1) corresponds to the zeroth (P0) of a polynominal register at the time of reading out of the shift register and at the time of writing therein, and the formula (2) corresponds to the first, second and third (P1), (P2) and (P3) of the polynominal register at the time of reading out of the shift register.

Next, the formula (1) is modified to obtain the following formula:

$$(PA)_n = P_0 \oplus (ID)_1 \oplus (ID)_2 \oplus \ldots \oplus (ID)_{n-1} \oplus (ID)_n \tag{3}$$

Further, the formula (2) is modified to obtain the following formula:

$$(PA)_n = P_0 \oplus (ID)_1 \ldots \oplus (ID)_n \oplus (OD)_1 \oplus \ldots \oplus (OD)_n \tag{4}$$

Figure 1:
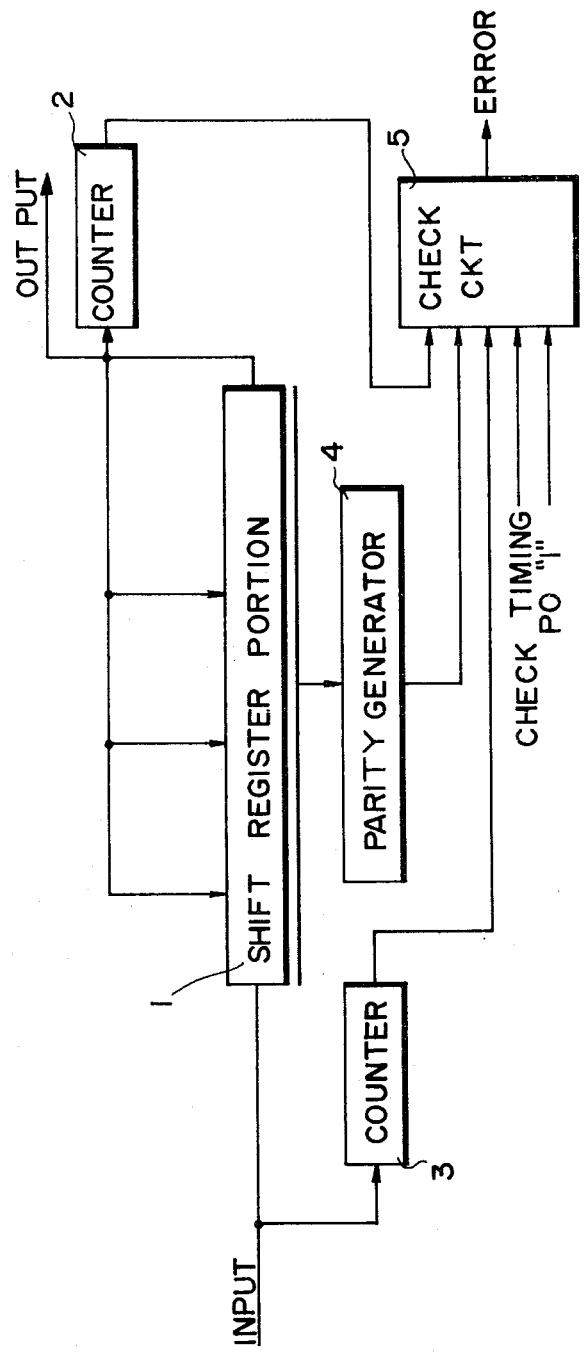
FIG. 1 is a block diagram showing an embodiment of this invention.

Since $P_0$ is "1" (in its initial state, the shift register is "0" in its all stages.), an ultimate parity (a predictive value) is obtained by counting the numbers of logical value "1" in output data and the numbers of logical value "1" in input data, and then, by comparing the predicted value with the value actually generated from the error correcting circuit, in order to detect malfunction of the error detection circuit. FIG. 1 is a block diagram showing an embodiment of this invention, in which a shift register has an even number of feedback loops. In FIG. 1, reference numeral 1 indicates a shift register portion; 2 designates a counter for counting the number of logical values of "1" in the output data; 3 identifies a counter for counting the number of logical values of "1" in the input data; 4 denotes a parity generator; and 5 represents a check circuit which provides the value of $(PA)_n$ in the aforesaid formula (4) and compares the value $(PA)_n$ with a signal from the parity generator 4.

Next, the operation of the embodiment of FIG. 1 will be described.

When input data has entered from the input end, it is sequentially applied to the shift register portion 1 previously reset at "0" in all stages and, at the same time, the number of logical values of "1" contained in the input data is counted by the counter 3. When the data has been sequentially applied to the shift register portion 1, output data is sequentially delivered out from the output end of the shift register portion 1, and the number of logical values of "1" in the output data is counted by the counter 2. During this time, the shift register portion 1 performs a parity check operation so as to derive a parity signal in the parity generator 4.

In the check circuit 5, by a check timing pulse which is applied at a desired time more than $1t$ after the shift operation, a parity predictive value of the shift register portion 1 of the $n$th term is calculated with the count values of the counters 3 and 2 and the zeroth $P_0$ of a polynomial register, and the parity prediction value is compared with the actual parity value applied from the parity generator 4 to the check circuit 5. In the case where the values are not coincident with each other, an error signal is produced to take proper steps.

Figure 2:
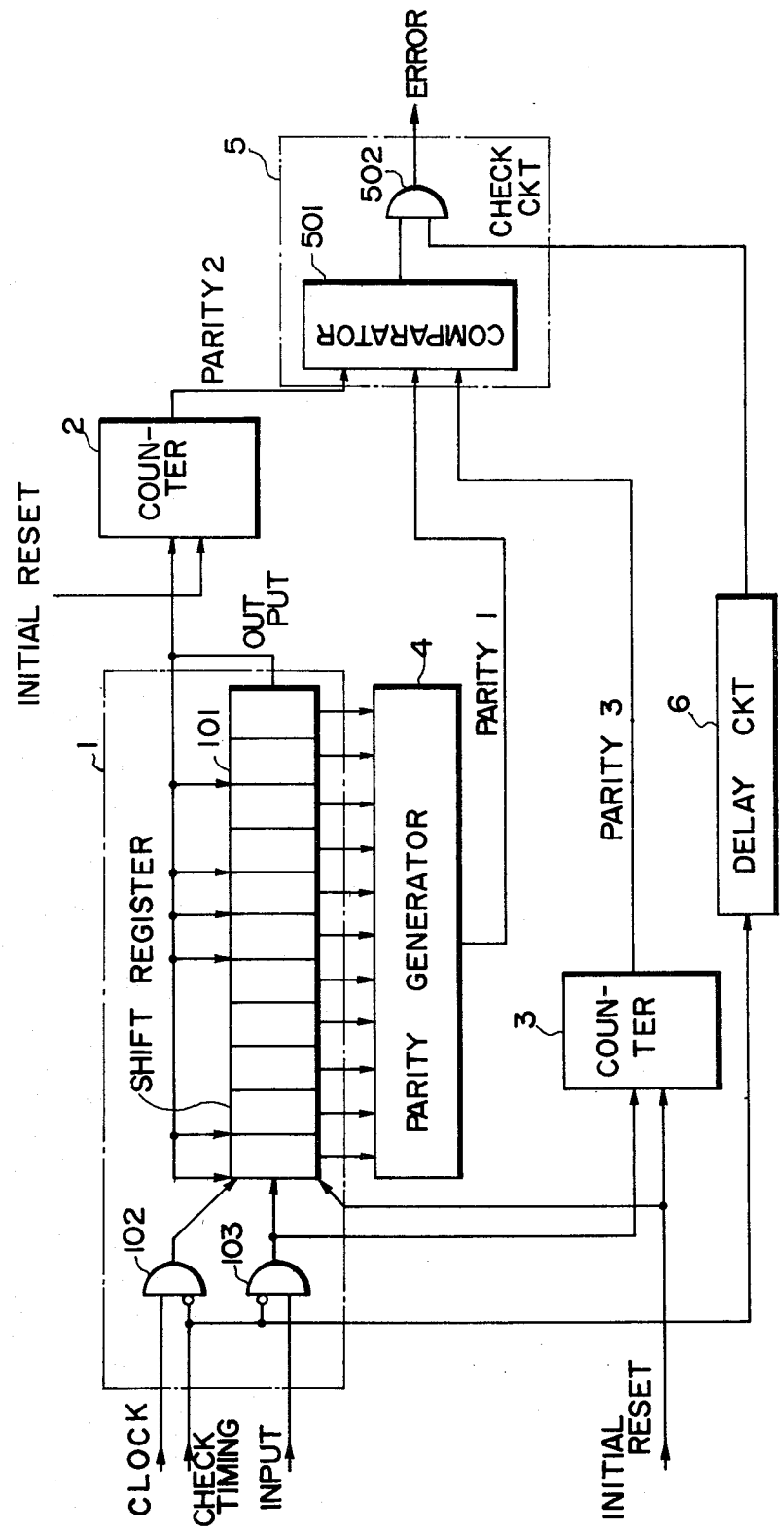
FIG. 2 is a block diagram illustrating the embodiment of FIG. 1 more in detail.

In the circuit having an odd number of feedback loops to the shift register portion 1, since no output data is necessary as seen from the aforesaid formula (3), the counter 2 shown in FIG. 2 is unnecessary.

FIG. 2 shows the embodiment of FIG. 1 in more detail. Reference numeral 1 indicates a shift register portion, which comprises a shift register 101 and gates 102 and 103. By an initial reset signal, the shift register 101 is reset to "0" at its all stages. When a check timing signal is "0", clock pulses are applied to the shift register 101 through the gate 102, and input data is applied to the shift register 101 and the counter 3 through the gate 103.

The counters 2 and 3 are, for instance, one-bit counters, which are preset by the initial reset signal to "1". The counter 3 counts the number of logical values of "1" contained in the input data applied thereto through the gate 103, and the counter 2 counts the number of logical values of "1" contained in the output data derived from the shift register 101.

Figure 3:
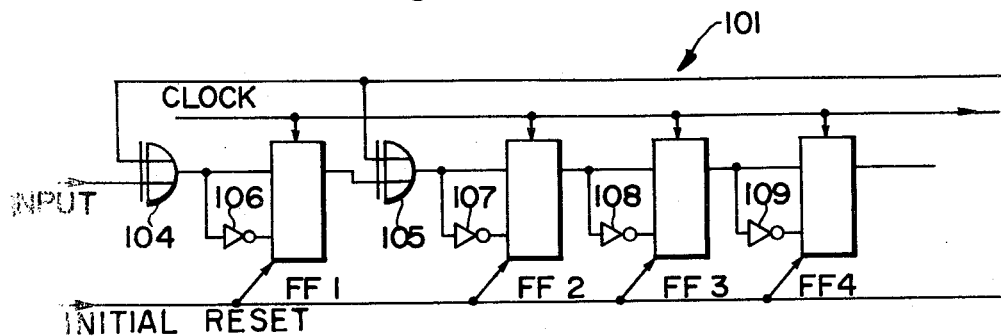
FIG. 3 is a block diagram showing the principal part of an example of a shift register used in FIG. 2.

The shift register 101 is shown to have an even number of feedback loops, and comprises (see FIG. 3) flip-flops FF1, FF2, FF3, FF4, . . . , exclusive OR gates 104 and 105 and inverters 106, 107, 108, 109, . . . , for example. By the initial reset signal, the flip-flops are all reset. The clock pulses are applied to the flip-flops through the gate 102 shown in FIG. 2. In the feedback loop, the exclusive OR operation is performed on the output from the preceding stage and the feed-back output data to obtain an exclusive OR output, which is applied to the flip-flop of the next stage.

Considering FIG. 2 again, the output from each stage of the shift register 101 is supplied to the parity generator 4, and a parity signal PARITY1 derived therefrom. Parity signals PARITY2 and PARITY3 from the counters 2 and 3, respectively, are applied to the check circuit 5. The check circuit 5 is composed of a comparator 501 and an AND gate 502. The AND gate 502 is supplied with the output from the comparator 501 and the check timing signal through a delay circuit 6 formed with a delay line or the like.

Figure 4:
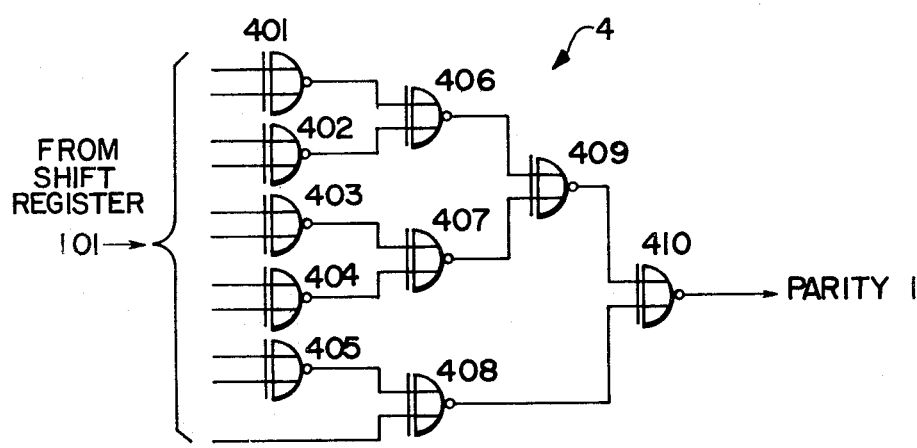
FIG. 4 is a block diagram illustrating an example of a parity generator used in FIG. 2.

As illustrated in FIG. 4, the parity generator 4 is comprised of, for example, exclusive NOR gates 401 to 410, and is supplied with the output from each stage of the shift register 101 to provide the parity signal PARITY1.

Figure 5:
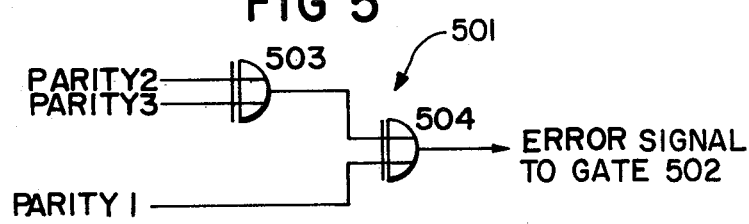
FIG. 5 is a block diagram showing an example of a check circuit used in FIG. 2.

The comparator 501 of the check circuit 5 comprises, for example, exclusive OR gates 503 and 504, as shown in FIG. 5, and produces an error signal in the case of non-coincidence resulting from the comparison of the parity signals.

When the check timing signal has become "1", the gates 102 and 103 close to restrain the clock pulse and input data from being applied to shift register 101, and by means of the delay circuit 6, time lags relative to the timing of counters 2 and 3 and the parity generator 4 are introduced so as to apply the check timing signal to the AND gate 502 of the check circuit 5, and in accordance with this timing, the result of comparison in the comparator 501 is derived as an output from the AND gate 502.

The parity generator 4 and the check circuit 5 in the above embodiment may also have various logic circuit constructions other than those shown in FIGS. 4 and 5. Further, this invention is also applicable to a data processing circuit having an error detection circuit other than the error correcting circuit.

In the foregoing embodiment, the parity signals and predictive parity signal are produced based on the logic value "1", but it is also possible to generate them based on the logic value "0".

As has been described in the foregoing, in the present invention, the recurrence formula generating logic is expanded to obtain an $n$th term and malfunction of the error detection circuit is checked at its last stage, so that malfunction of an error detection circuit provided in a circuit of a short cycle period can be detected without using any high-speed elements.

It will be apparent that many modifications and variations may be effected without departing from the scope of the novel concepts of this invention.

What is claimed is:

1. An error detection circuit checking system for checking error detection within a data processing circuit, said system receiving input data and having a data storing state for storing said input data and an output stage for providing said stored data as output data, comprising:
    an error detection circuit of said data processing circuit, the error detection circuit having a parity generator for deriving a parity signal;
    a predictive parity signal generator comprising means for counting the numbers of a predetermined logic value in the input data of the data processing circuit, and means for counting the numbers of said predetermined logic value in said output data of the data processing circuit; and
    means for comparing the parity signal derived by the parity generator with the predictive parity signal from the predictive parity signal generator to detect malfunction of the error detection circuit.

2. The error detection circuit checking system of claim 1, wherein said predetermined logic value is logical "1".

3. The error detection circuit checking system of claim 1, wherein said predetermined logic value is logical "0".

4. An error detection circuit checking system comprising:
- an error detection circuit including a shift register having a plurality of storing stages for sequentially receiving input data shifted thereto and having an output stage for feeding back output data from the output stage to selected ones of the storing stages, and a parity generator for generating a parity signal in accordance with the data storing state of the storing stages of said shift register;
- means for generating a predictive parity signal from a value obtained by counting the numbers of a predetermined logic value in the input data and in the output data, respectively, when the number of said selected ones of the storing stages supplied with the output data fed back from the output stage of the shift register is even, a further value obtained by counting the numbers of a predetermined logic value in the input data when the number of said selected ones of the storing stages is odd, and an initial value determined by the data storing state of the shift register in its initial state; and
- means for comparing the parity signal derived from the parity generator with the predictive parity signal from the predictive parity signal generating means to detect malfunction of the error detection circuit.

5. The error detection circuit checking system according to claim 4, wherein said means for generating said predictive parity signal derives the $n$th predictive parity signal from the $(n-1)$th parity signal and from the $n$th input data and $n$th output data produced when the $n$th input data has been applied to the shift register.

6. The error detection circuit checking system of claim 4, wherein said predetermined logic value is logical "1".

7. The error detection circuit checking system of claim 4, wherein said predetermined logic value is logical "0".

8. The error detection circuit checking system according to claim 4, wherein said means for generating said predictive parity signal derives the $n$th predictive parity signal from the $(n-1)$th parity signal and from the $n$th input data.

9. In a data processing circuit having an error detection circuit comprising a shift register having a plurality of storing stages for sequentially receiving as contents thereof input data shifted thereto and an output stage for providing output data, said error detection circuit further comprising:
- feedback means connecting said output stage to selected ones of said storing stages for feeding back said output data thereto, and
- parity generator means connected to said shift register for generating a parity signal in accordance with parity checking the contents of said storing stages;
- the improvement comprising predicting means for predicting said parity signal from the contents of said storing stages at an initial time by counting the numbers of a predetermined logic value in said input data over a period of time after said initial time, and by counting the numbers of said predetermined logic value in said output data, and comparing means for comparing said parity signal generated by said parity generator means with said parity signal predicted by said predicting means to produce an error detection signal indicating lack of coincidence therebetween.

10. In the data processing circuit according to claim 9, wherein said predicting means includes respective counters connected to count the numbers of said predetermined logic value in said input data and said output data, respectively.

11. An error detection circuit checking system for checking error detection within a data processing circuit, said system receiving input data, comprising:
- an error detection circuit of said data processing circuit, further comprising a shift register having a plurality of storing stages for sequentially transferring said input data, and an output stage for providing said sequentially transferred input data as output data, and feeding back said output data from said output stage to a desired one of the storing stages and to a parity generator, said error detection circuit further comprising means for generating a parity signal from the parity generator in accordance with the data storage state of said shift register;
- counter means for counting at least one of the number of said input data of a predetermined logic value and the number of said output data of said predetermined logic value;
- initializing means for initializing said shift register and said counter means to have said predetermined logic value;
- predictive parity generating means for generating a predictive parity signal based on an initial value determined in accordance with the data storage state of the shift register in its initial state as initialized by said initializing means, and the counter value of said counter means; and
- means for comparing the parity signal from the parity generator with the predictive signal from the predictive parity generating means to detect malfunction of the error detection circuit.

12. The error detection circuit checking system of claim 11, wherein said predetermined logic value is logical "1".

13. The error detection circuit checking system of claim 11, wherein said predetermined logic value is logical "0".

14. The error detection circuit checking system of claim 11, wherein said counter means counts both of the number of input data of said predetermined value and the number of output data of said predetermined value.

* * * * *